United States Patent
Fukazawa

(10) Patent No.: US 7,109,060 B2
(45) Date of Patent: Sep. 19, 2006

(54) MANUFACTURING METHOD OF SEMICONDUCTOR DEVICE, SEMICONDUCTOR DEVICE, CIRCUIT SUBSTRATE AND ELECTRONIC EQUIPMENT

(75) Inventor: Motohiko Fukazawa, Suwa (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 11/014,572

(22) Filed: Dec. 16, 2004

(65) Prior Publication Data

US 2005/0136568 A1    Jun. 23, 2005

(30) Foreign Application Priority Data

Dec. 18, 2003    (JP)    ............... 2003-420807

(51) Int. Cl.
*H01L 21/44*    (2006.01)
(52) U.S. Cl. .................................. 438/109
(58) Field of Classification Search .................. 438/10, 438/14, 17, 100–101, 107–114, 118, 121, 438/124, 128–129, 584, 597–598, 618, 625, 438/637, 641, 654, 667
See application file for complete search history.

(56) References Cited

U.S. PATENT DOCUMENTS

| | | | |
|---|---|---|---|
| 6,271,056 B1 * | 8/2001 | Farnworth et al. ........... | 438/106 |
| 6,313,521 B1 * | 11/2001 | Baba ........................... | 257/678 |
| 6,737,743 B1 * | 5/2004 | Urakawa ..................... | 257/724 |
| 6,759,272 B1 * | 7/2004 | Tsubosaki et al. .......... | 438/109 |
| 6,797,603 B1 * | 9/2004 | Murayama et al. ......... | 438/614 |
| 2004/0031972 A1 * | 2/2004 | Pflughaupt et al. ......... | 257/200 |

FOREIGN PATENT DOCUMENTS

JP    2002-050738    2/2002

* cited by examiner

*Primary Examiner*—Michael Lebentritt
*Assistant Examiner*—Andre' C. Stevenson
(74) *Attorney, Agent, or Firm*—Harness, Dickey & Pierce, P.L.C.

(57) ABSTRACT

A method of manufacturing a semiconductor device is provided. The method includes embedding and forming a coupling terminal as an external electrode of an electronic circuit on an active surface side of a substrate having an active surface formed with a plurality of electronic circuits, exposing a part of the coupling terminal by polishing a back surface side of the substrate, mounting a semiconductor chip on the back surface side of the substrate via the coupling terminal, sealing the semiconductor chip mounted on the substrate by a sealing material, and cutting the substrate for every forming area of each electronic circuit and dividing it into a plurality of semiconductor devices.

8 Claims, 15 Drawing Sheets

F I G. 4 (a)
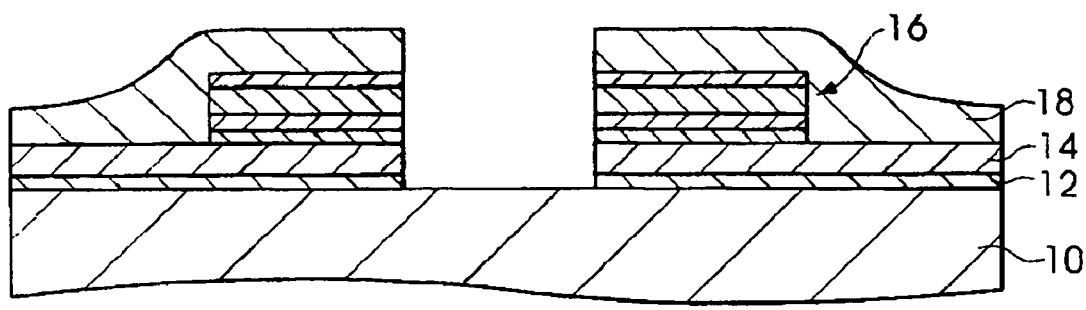
F I G. 4 (b)
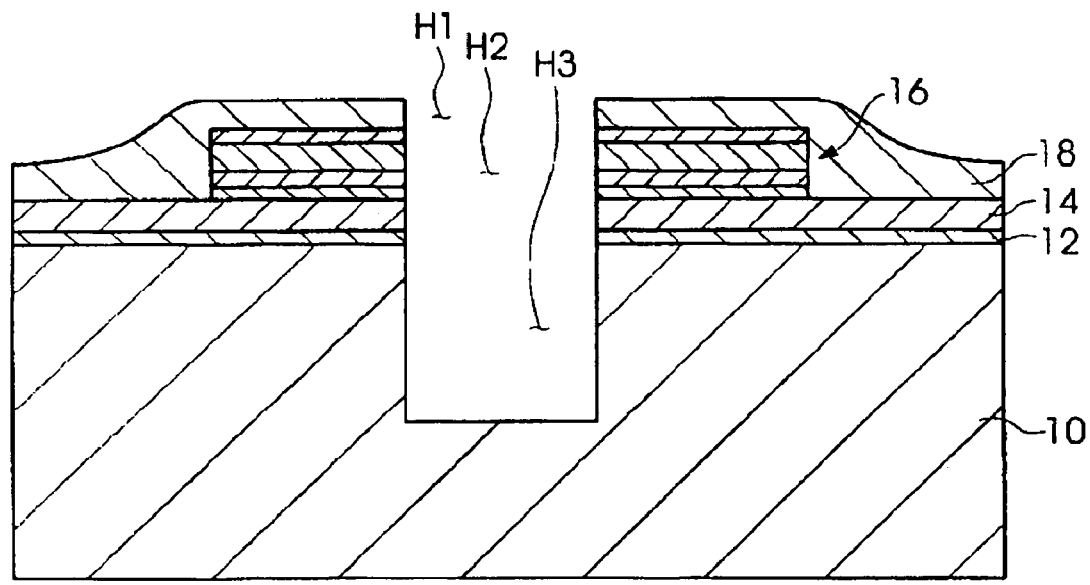

F I G. 8
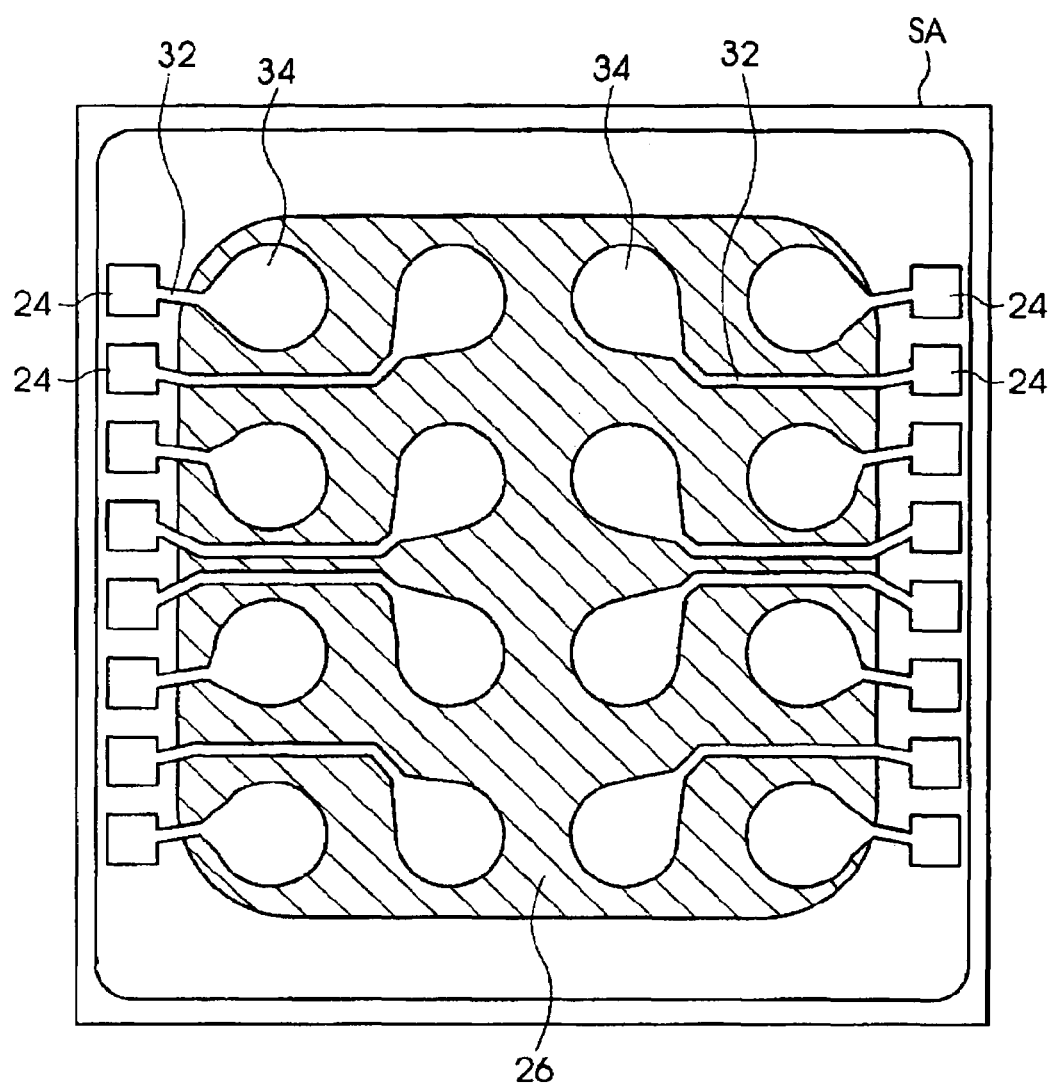

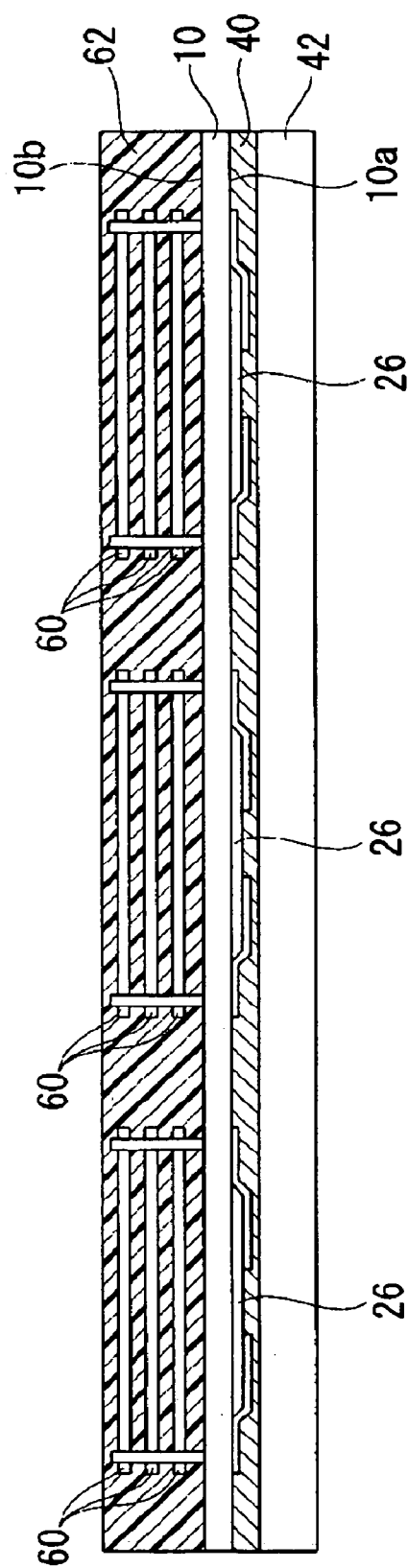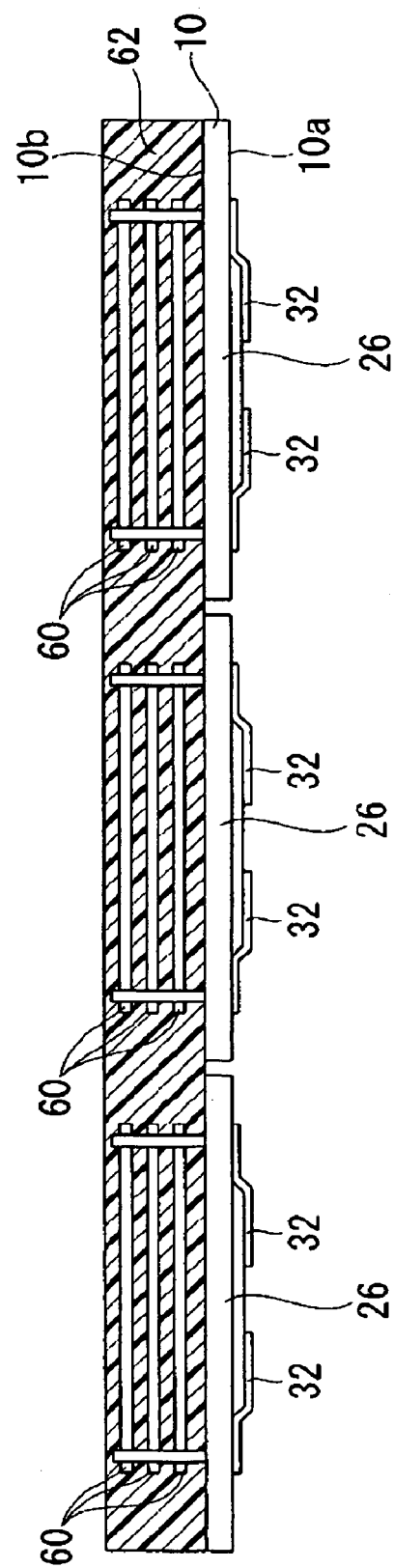
F I G. 1 2 (a)   F I G. 1 2 (b)

MANUFACTURING METHOD OF SEMICONDUCTOR DEVICE, SEMICONDUCTOR DEVICE, CIRCUIT SUBSTRATE AND ELECTRONIC EQUIPMENT

RELATED APPLICATIONS

This application claims priority to Japanese Patent Application No. 2003-420807 filed Dec. 18, 2003 which is hereby expressly incorporated by reference herein in its entirety.

BACKGROUND

1. Field of the Invention

The present invention relates to a manufacturing method of a semiconductor device, a semiconductor device, a circuit substrate and electronic equipment.

2. Related Art

Currently, since electronic equipment having portability such as a portable phone, a notebook size personal computer, and a PDA (Personal data assistance), and equipment such as a sensor, a micro-machine, and a printer head are small sized and light weight, miniaturization of various electronic parts of a semiconductor chip or the like installed inside have been made. Moreover, these electronic parts are extremely limited in the mounting space.

Therefore, research and development for manufacturing a micro semiconductor chip using a technology called a chip scale package (CSP) or a wafer level chip scale package (W-CSP) has been actively carried out (for example, refer to Japanese Unexamined Patent Publication No. 2002-50738). In the wafer aspect of the W-CSP technology, since the wafer is divided into individual semiconductor chips after a rearrangement wiring (re-wiring) and a sealing with a resin, a semiconductor device having an area approximately equal to the chip area can be manufactured.

For further high integration, by depositing the semiconductor chips having the same function or semiconductor chips having a different function and electrically coupling each semiconductor chip, a three-dimensional mounting technology for making high density mounting of the semiconductor chip is devised.

Attempts to realize a greater density have recently been carried out through three-dimensional mounting on an active surface of a W-CSP substrate. More specifically, after a coupling terminal as an external electrode is embedded and formed on the active surface side of a wafer formed with an electronic circuit, a semiconductor chip is deposited via this coupling terminal, and at last, the back surface of the wafer is polished to expose a part of the coupling terminal. Then, the wafer is cut in a state in which the chip mounted on the wafer is cut into an individual semiconductor device.

According to this method, in order to mount the semiconductor device on a circuit substrate having a different terminal arrangement, it is necessary to form the rearrangement wiring or the like on the back surface side of the wafer. However, it is technically difficult to form a wiring or the like on a polished surface, or the step becomes complicated by forming a new wiring layer.

The present invention has been made in view of such problems, and is intended to provide a manufacturing method of a semiconductor device that more easily realizes a high density mounting, a semiconductor device thereof, and a circuit substrate and electronic equipment having the semiconductor device.

SUMMARY

In order to solve the above described problem, a manufacturing method of a semiconductor device according to the present invention comprises: embedding and forming a coupling terminal as an external electrode of an electronic circuit on an active surface side of a substrate having an active surface formed with a plurality of electronic circuits; exposing a part of the coupling terminal by polishing a back surface side of the substrate; mounting a semiconductor chip on the back surface side of the substrate via the coupling terminal; sealing the semiconductor chip mounted on the substrate with a sealing material; and cutting the substrate for every forming area of each electronic circuit and dividing it into a plurality of semiconductor devices.

In the present method, since the active surface of the substrate finally becomes the mounting surface, by simultaneously forming the coupling terminal or the like and the rearrangement wiring or the like on the active surface side in advance, the step can be simplified as compared to the conventional one (that is, the case in which the chip is three-dimensionally mounted on the active surface side of the substrate and making the back surface side of the substrate the mounting surface). Moreover in the present method, since the rearrangement wiring or the like is formed on the active surface side of the substrate, it becomes easier to form as compared to the conventional case in which the rearrangement wiring or the like is formed on the back surface side (polishing surface) of the substrate.

In addition, in the present method, it is preferable to carry out the cutting of the substrate from the active surface side of the substrate.

When cutting is performed in this manner, chipping rarely occurs as compared with the case in which the cutting is carried out from the back surface side of the substrate. When the dicing or the like is carried out from the back surface side of the substrate, the active surface side of the substrate is fixed with a dicing tape or the like. However, such a dicing tape is required to be thin, so as a result, the substrate as the adhered sometimes cannot be sufficiently held (that is, oscillation occurs between the adhered and the tape). When such oscillation occurs during cutting, there is a risk of chipping the substrate (chipping) when the tip end portion of the blade penetrates to the tape side from the substrate.

In the present method, since the substrate is surely held by the sealing member of a thick film that seals the semiconductor chip, when the tip end portion of the blade penetrates from the substrate to the sealing member side, the space between the two does not oscillate. In the cutting step of the substrate, the supporting member for supporting the substrate may be separately prepared, however, in the present method, since the active surface side of the substrate is protected by the sealing member of the thick film, the substrate can be diced using this sealing member as the supporting member. In this way, the step of attaching the supporting member or the like becomes unnecessary, and the step becomes easier.

Prior to the cutting of the substrate, it is preferable to provide a step for testing each of the semiconductor devices. In this way, as compared with the case in which the testing step is carried out after the cutting of the substrate (that is, once the substrate has been divided into individual semiconductor devices), the testing becomes easier.

Prior to mounting of the semiconductor chip, it is preferable that the step of testing each electronic circuit formed on the active surface is provided. In mounting the semiconductor chip, the semiconductor chip is mounted only on the electronic circuit that turns out to be non-defective in the testing of the electronic circuit. By sorting out the non-defective circuits in advance, the mounting of the chips thereafter can be carried out without waste. In mounting the semiconductor chips, it is preferable to mount a dummy chip with respect to the electronic circuit that turns out defective in the testing of the electronic circuit. In this way, the flow of the sealing material becomes uniform, and the air bubble is hardly mixed in the sealing member.

The step of mounting the semiconductor chip may be made into a step of three dimensionally mounting a plurality of semiconductor chips on the back surface side of the substrate via the coupling terminal. In this case, the semiconductor chip has a through electrode, and in the step of mounting the semiconductor chip, a plurality of a semiconductor chips are deposited via the through electrode.

Moreover, the semiconductor device of the present invention is manufactured by the above described method. Moreover, the circuit substrate or the electronic equipment of the present invention is provided with the above described semiconductor device. Accordingly, it is possible to provide an inexpensive high performance device.

BRIEF DESCRIPTION OF THE DRAWINGS

FIG. 4(a) and FIG. 4(b) are cross-sectional views of the process following FIG. 3(c).

FIG. 8 is a schematic view showing a plan structure of a substrate formed with a rearrangement wiring

FIG. 12(a) and FIG. 12(b) are cross-sectional views showing a sealing step and a cutting step for the substrate.

DETAILED DESCRIPTION

Figure 1:
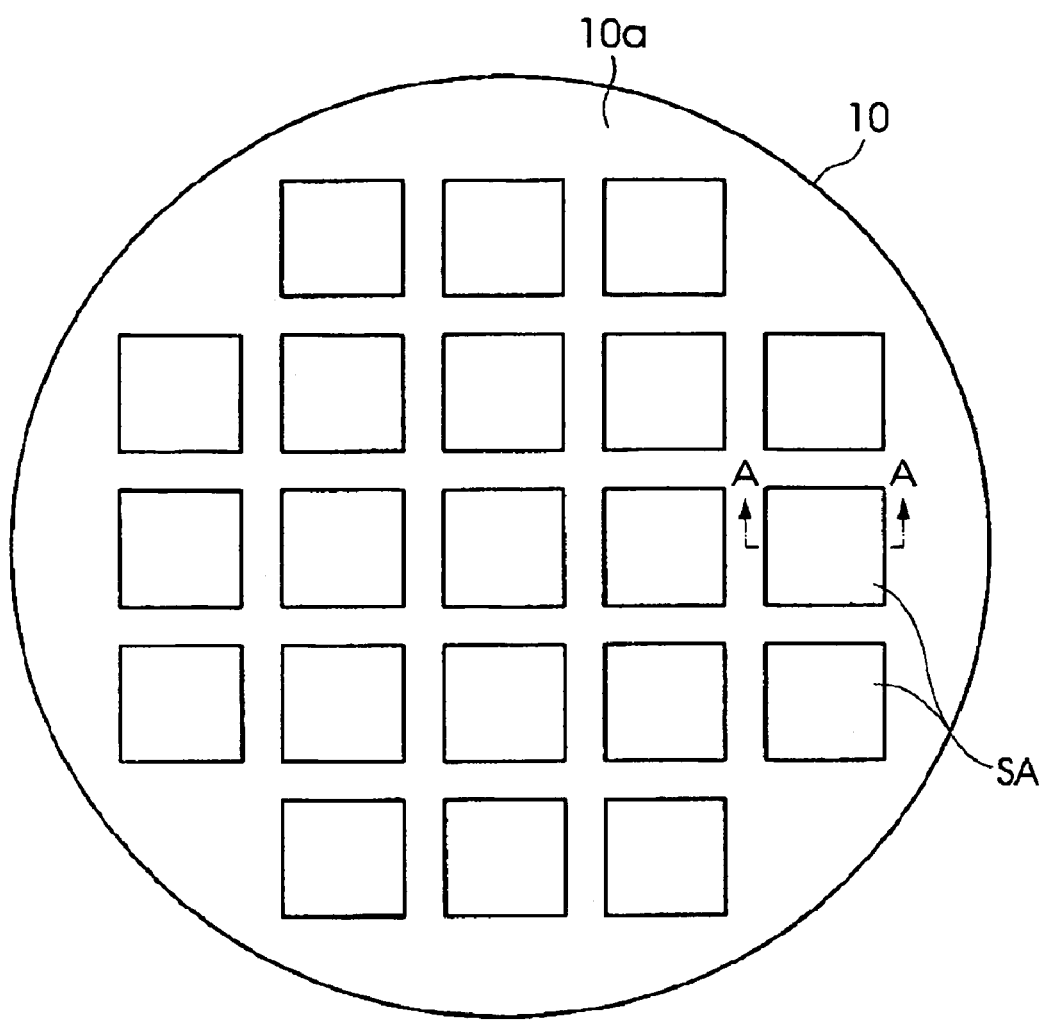
FIG. 1 is a plan view of a substrate used in a manufacturing method of a semiconductor device according to the present invention.

Hereinafter, referring to the drawing, a manufacturing method of a semiconductor device, a semiconductor device, and electronic equipment will be described in detail according to one embodiment of the present invention. The outline of the manufacturing method of the semiconductor device of the present embodiment has an aspect in the point that an individual semiconductor chip is deposited on a wafer (substrate) that is thinned, and the entire manufacturing step is generally classified into: a first step of processing a substrate on which the semiconductor chip is deposited; a second step of manufacturing the semiconductor chip to be deposited; and a third step of mounting the chip on the substrate. These steps may be carried out sequentially, and the first step and the second step maybe carried out in parallel. In view of the manufacturing efficiency, it is preferable to form the semiconductor chip in the second step in advance, and carry out the third step after the first step is completed. Hereinafter, each of these steps is described in detail.

First Step

FIG. 1 is an upper surface view of a substrate (semiconductor substrate) used in a manufacturing method of a semiconductor device according to one embodiment of the present invention. A substrate 10 is, for example, a Si (silicon) substrate, and on an active surface 10a, a plurality of section areas (shot area) SA are set. In each section area SA, an electronic circuit comprising a transistor, a memory element, other electronic elements, an electric wiring, and an electrode pad 16 (refer to FIG. 3) or the like, are formed. On the other hand, on a back surface side 10b (refer to FIG. 2) of the substrate 10, such electronic circuit is not formed.

Figure 2:
FIG. 2(a) through FIG. 2(g) are cross-sectional views showing an example of the manufacturing method of a semiconductor device of the present invention.
Figure 2:
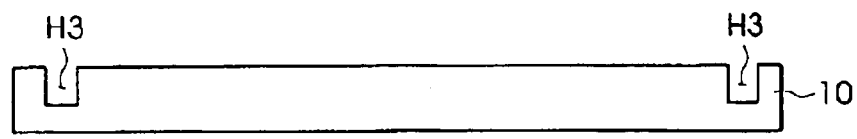
Figure 2:
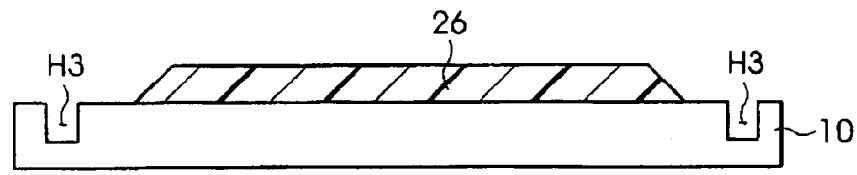
Figure 2:
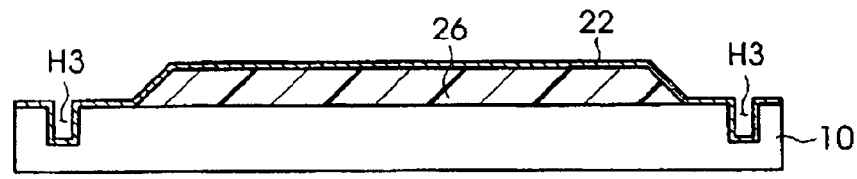
Figure 2:
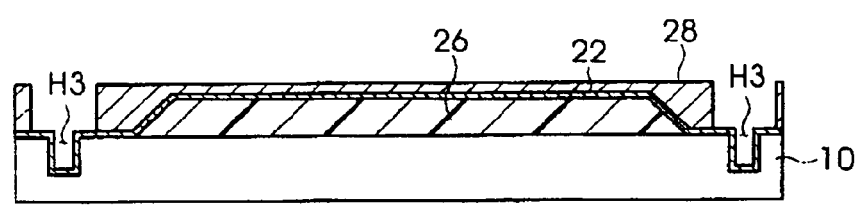
Figure 2:
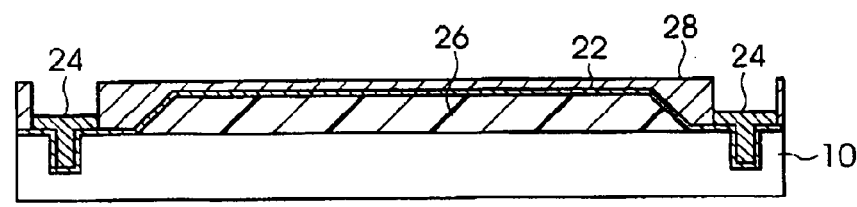
Figure 2:
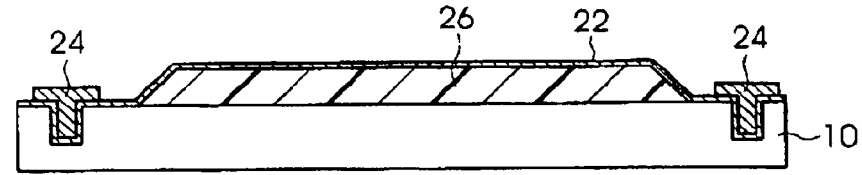

FIG. 2 is a view showing a step of forming a stress relief layer 26 and a coupling terminal 24 in a manufacturing method of a semiconductor device according to one embodiment of the present invention. Moreover, FIG. 3 through FIG. 6 are cross sectional views, showing in detail, a surface portion of the substrate 10 that is processed by the manufacturing method of the semiconductor device according to one embodiment of the present invention. FIG. 2a is a schematic cross sectional view of a part indicated with A—A line in FIG. 1. In addition, the thickness of the substrate 10 is, for example, about 500 μm.

Here, a structure of the active surface 10a side of the substrate 10 will be described in detail. FIG. 3a is an enlarged view of the area indicated by the reference numeral B in FIG. 2a. As shown in FIG. 3a, on the substrate 10, an insulating film 12 composed of an oxide film of Si ($SiO_2$) which is a basic material of the substrate 10 and an interlayer insulating film 14 composed of borophosphosilicate glass (BPSG), are sequentially formed.

An electrode pad 16 electrically coupled to the electronic circuit formed on the active surface 10a of the substrate 10 in a part not shown, is formed on the interlayer insulating film 14. Such electrode pad 16 is formed by sequentially depositing a first layer 16a composed of Ti (titanium), a second layer 16b composed of TiN (titanium nitride), a third layer 16c composed of AlCu (aluminum/copper), and a forth layer (cap layer) 16d composed of TiN. In addition, regard that the electronic circuit is not formed below the electrode pad 16.

The electrode pad 16 is formed, for example, by forming a multi layered structure composed of the first layer 16a through the forth layer 16d on the entire surface of the interlayer insulating film 14 by sputtering, and by patterning into a predetermined form (for example, round form) by using a resist or the like. The case in which the electrode pad 16 is formed by the above described multi-layered structure will be explained as an example, and the electrode pad 16 may be formed only with Al. However, it is preferable to form the electrode pad 16 by using copper with low electric resistance. The electrode pad 16 is not limited to the above described structure, and may be appropriately modified according to the required electrical property, physical property, and chemical property.

Moreover, on the interlayer insulating film 14, a passivation film 18 is formed so as to cover a part of the electrode pad 16. This passivation film 18 is preferably formed of $SiO_2$ (silicon oxide), SiN (silicon nitride), polyimide resin or the like, or has a structure depositing $SiO_2$ on SiN or the reverse of that. The preferred film thickness of the passivation film 18 is about 2 μm or more and about 6 μm or less.

Making the film thickness of the passivation film 18 to be about 2 μm or more is because it is necessary for ensuring the above described selection ratio. Moreover, making the film thickness of the passivation film 18 to be about 6 μm or less is because, when electrically coupling the coupling terminal 24 (refer to FIG. 6*b*) formed on the electrode pad 16 in the process described later and the electrode pad 16, it is necessary to etch the passivation film 18 on the electrode pad 16, and there is a risk of slowing down the manufacturing process if the film thickness is too thick.

With respect to the substrate 10 of the above described structure, first, as shown in FIG. 2*b*, a step of forming a hole portion H3 in the active surface 10*a* of the substrate 10 is carried out. FIG. 2*b* is a cross sectional view showing the state in which the hole portion H3 is formed on the substrate 10. Such hole portion H3 is for forming the coupling terminal 24 as an external terminal of the electronic circuit formed on the active surface 10*a* side of the substrate 10 into a form in which a part thereof is embedded in the substrate 10. Such hole portion H3 is formed in a position of the electrode pad 16 shown in FIG. 3*a* so as to penetrate the electrode pad 16. Here, the step of forming the hole portion H3 is described in detail with reference to FIG. 3 through FIG. 5.

First, the resist (not shown) is applied on the entire surface of the passivation film 18 by a method such as a spin coat method, a dipping method, or a spray coat method. A resist is used for opening the passivation film 18 covering the electrode pad 16, and may be any of a photoresist, an electron beam resist, or an X-ray resist, and may be either a positive type or a negative type.

After applying the resist on the passivation film 18 and carrying out pre-baking, an exposure process and a development process are carried out using a mask formed with a predetermined pattern and the resist is patterned into a predetermined form. The form of the resist is set according to the opening form of the electrode pad 16 and the cross sectional form of the hole formed on the substrate 10. When the resist patterning is completed and the post-bake is carried out, as shown in FIG. 3*b*, a part of the passivation film 18 covering the electrode pad 16 is etched, and an open portion H1 is formed. FIG. 3*b* is a cross sectional view showing the state in which the passivation film 18 is opened and the open portion H1 is formed.

When etching the passivation film 18, it is preferable to apply a dry etching. The dry etching may be a reactive ion etching (RIE). Moreover, for etching the passivation film 18, a wet etching maybe applied. The cross sectional form of the open portion H1 formed on the passivation film 18 is set according to the opening form of the electrode pad 16 formed in the step described later and the cross sectional form of the hole formed in the substrate 10, and the diameter thereof is set approximately equal to the diameter of the opening formed on the electrode pad 16 and the diameter of the hole formed on the substrate 10, for example about 50 μm.

When the above described step is completed, by using the resist on the passivation film 18 formed with the open portion H1 as a mask, the electrode pad 16 is opened by the dry etching. FIG. 3*c* is a cross sectional view showing the state in which an open portion H2 is formed by opening the electrode pad 16. In addition, in FIG. 3*a* through FIG. 3*c*, the resist is omitted in the drawing. As shown in FIG. 3*c*, the diameter of the open portion H1 formed on the passivation film 18 and the diameter of the open portion H2 formed on the electrode pad 16 are approximately equal. In addition, RIE may be applied for dry etching.

Further, by using the resist used in the above described step as a mask, the interlayer insulating film 14 and the insulating film 12 are etched next, and the substrate 10 is exposed as shown in FIG. 4*a*. FIG. 4*a* is a cross sectional view showing the state in which a part of the substrate 10 is exposed by etching the interlayer insulating film 14 and the insulating film 12. Then, the resist formed on the passivation film 18 used as an opening mask is peeled by a peeling liquid, ashing or the like.

In addition, in the above described process, etching was repeated using the same resist mask, however, needless to say, the resist may be re-patterned after each etching step is completed. Moreover, by peeling the resist after the open portion H2 formed on the electrode pad 16 is opened, and by etching the interlayer insulating film 14 and the insulating film 12 using TiN of the uppermost surface of the electrode pad 16 as a mask, it is possible to expose the substrate 10 as shown in FIG. 4*a*. Further, in consideration of the selection ratio at the time of each etching, it is necessary to thicken the resist.

When the above described step is completed, by using the passivation film 18 as a mask, the substrate 10 is bored by the dry etching as shown in FIG. 4*b*. As for the dry etching, in addition to the RIE, ICP (inductively coupled plasma) may be applied. FIG. 4*b* is a cross sectional view showing the state in which the hole portion H3 is formed by boring the substrate 10.

As shown in FIG. 4*b*, since the substrate 10 is bored using the passivation film 18 as a mask, the diameter of the hole portion H3 formed on the substrate 10 is approximately equal to the diameter of the open portion H1 formed on the passivation film 18. As a result, the diameter of the open portion H1 formed on the passivation film 18, the diameter of the open portion H2 formed on the electrode pad 16, and the diameter of the hole portion H3 formed on the substrate 10 become approximately equal. The depth of the hole portion H3 is appropriately set according to the thickness of the final semiconductor chip.

Moreover, as shown in FIG. 4*b*, when the hole portion H3 is formed on the substrate 10, a part of the passivation film 18 is etched by the dry etching, and therefore the film thickness thereof becomes thinner. Here, when forming the hole portion H3, the passivation film 18 is removed by etching, and the electrode pad 16 or the interlayer insulating film 14 are exposed, it is unfavorable in implementing the later steps, or ensuring the reliability as a semiconductor device. Therefore, in the state shown in FIG. 3*a*, the film thickness of the passivation film 18 is set to 2 μm or more.

When the above described step is completed, an insulating film 20 is formed on the passivation film 18 and on an inner wall and a bottom surface of the hole portion H3. FIG.

5a is a cross sectional view showing the state in which the insulating film 20 is formed above the electrode pad 16 and on the inner wall and the button surface of the hole portion H3. This insulating film 20 is provided for preventing, such as the occurrence of an electric current leakage, encroachment of the substrate 10 due to oxygen and moisture or the like, and may use tetra ethyl ortho silicate ($Si(OC_2H_5)_4$: hereinafter referred to as a TEOS) formed by applying PEVCD (plasma enhanced chemical vapor deposition), that is PE-TEOS, TEOS formed by using ozone CVD, that is $O_3$-TOES, or silicon oxide formed by using CVD. The thickness of the insulating film 20 is, for example, 1 μm.

Subsequently, the resist (not shown) is applied on the entire surface of the passivation film 18 by a method such as a spin coat method, a dipping method, or a spray coat method. Alternatively, a dry film resist may be used. In addition, such a resist is used for opening the upper side of a part of the electrode pad 16, and may be any of a photoresist, an electron beam resist, or an X-ray resist, and may be either a positive type or a negative type.

After applying the resist on the passivation film 18 and carrying out the pre-bake, an exposure process and a development process are carried out using a mask formed with a predetermined pattern. The resist is patterned into a form in which the resist remains in a portion other than the upper side of the electrode pad 16, the hole portion H3, and only in a peripheral portion thereof, that is, in a circular form around the hole portion H3. When the patterning of the resist is completed, following the post-baking, the insulating film 20 covering a part of the electrode pad 16 and the passivation film 18 is removed by etching, and a part of the electrode pad 16 is opened. When etching, it is preferable to employ dry etching. The dry etching may be a reactive ion etching (RIE). Moreover, as for etching, wet etching may be employed. At this time, the forth layer 16d constituting the electrode pad 16 is removed.

FIG. 5b is a cross sectional view showing the state in which a part of the insulating film 20 covering the electrode pad 16 and the passivation film 18 are removed. As shown in FIG. 5b, the upper side of the electrode pad 16 becomes the open portion H4 and becomes the state in which a part of the electrode pad 16 is exposed. According to the open portion H4, the coupling terminal (electrode portion) 24 formed in a later step and the electrode pad 16 can be coupled. Accordingly, the open portion H4 may be formed on the portion other than the portion where the hole portion H3 is formed. Moreover, it may be adjacent.

In the present embodiment, the case in which hole portion H3 (open portion H1) is formed substantially in the center of the electrode pad 16, is exemplified. It is preferable that the open portion H4 surrounds this hole portion H3, that is, to make the exposed area of the electrode pad 16 larger, in terms of making the coupling resistance with the coupling terminal formed later small. The forming location of the hole portion H3 is not necessary to be substantially in the center of the electrode pad, and a plurality of holes may be formed. In addition, after removing a part of the insulating film 20 and the passivation film 18 covering the electrode pad 16, and exposing a part of the electrode pad 16, the resist used when removing is peeled by a peeling liquid.

After the steps described above, the hole portion H3 shown in FIG. 2b is formed. After forming the hole portion H3 in the substrate 10, the photosensitive polyimide is applied on the entire surface of the active surface 10a of the substrate 10 and the pre-bake is carried out. Then an exposure process and a development process are carried out with respect to the photosensitive polyimide using a mask formed with a predetermined pattern, and the photosensitive polyimide is patterned into a predetermined form. Then, the post-baking is carried out and a stress relief layer 26 is formed. This stress relief layer 26 is provided for relieving the stress generated by the difference between the thermal expansion coefficient of the semiconductor chip including the substrate 10 and the thermal expansion coefficient of the substrate or the like mounting the semiconductor chip.

When the above described step is completed, as shown in FIG. 2d, the step of forming a base film 22 on the substrate 10 in which the stress relief layer 26 is formed, is carried out. FIG. 2d is a cross sectional view showing the state in which the stress relief layer 26 is formed on the substrate 10. Since the base film 22 is formed on the entire upper surface of the substrate 10, the base film 22 is formed on the exposed portion of the electrode pad 16 and the inner wall and the bottom portion of the hole portion H3 as shown in FIG. 5b. The base film 22 is composed of a barrier layer and a seed layer. After forming the barrier layer, the film is formed by forming the seed layer on the barrier layer. The barrier layer is formed of, for example, TiW, and the seed layer is formed of Cu. These are formed by, for example, an IMP (ion metal plasma) method, or a PVD (physical vapor deposition) method such as a vacuum deposition, a sputtering, or ion plating.

FIG. 6a is a cross sectional view showing the state in which the base film 22 is formed in the hole portion H3. As shown in FIG. 6a, the base film 22 sufficiently covers the step ST of the electrode pad 16 and the insulating film 20, and is continuously formed on the electrode pad 16 and on the insulating film 20 (including the inner portion of the hole portion H3). In addition, the film thickness of the barrier layer constituting the base film 22 is, for example, about 100 nm, and the film thickness of the seed layer is, for example, about several hundred nm. Since the base film 22, necessary for forming a coupling terminal 24 and a rearrangement wiring 32 described later, is formed on the substrate 10 in one step in the present embodiment, it is possible to simplify the manufacturing process.

When the formation of the base film 22 is completed, a plating resist is applied on the active surface 10a of the substrate 10, and by patterning the plating resist into a state in which only the portion forming the coupling terminal 24 is opened, a plating resist pattern 28 is formed. FIG. 2e, is a cross sectional view showing the state in which the plating resist pattern is formed. A Cu (copper) electrolytic plating is then carried out when Cu is embedded in the hole portion H3 of the substrate 10 and the open portion of the plating resist pattern 28 as shown in FIG. 2f, and the coupling terminal 24 is formed. FIG. 2f is a cross sectional view showing the state in which the coupling terminal 24 is formed by carrying out the Cu electrolytic plating.

When the coupling terminal 24 is formed, as shown in FIG. 2g, the plating resist pattern 28 formed on the substrate 10 is peeled. FIG. 2g is a cross sectional view showing the state in which the plating resist pattern 28 is peeled after the coupling terminal 24 is formed. Moreover, FIG. 6b is a cross sectional view showing the details of the structure of the formed coupling terminal 24. As shown in FIG. 2g, the coupling terminal 24 is a protruding form that is protruded in the active surface 10a of the substrate 10, and is a form wherein a part thereof is embedded in a substrate 10. Moreover, as shown in FIG. 6b, in the part indicated by the reference numeral C, the coupling terminal 24 and the electrode pad 16 are electrically coupled.

Figure 7:
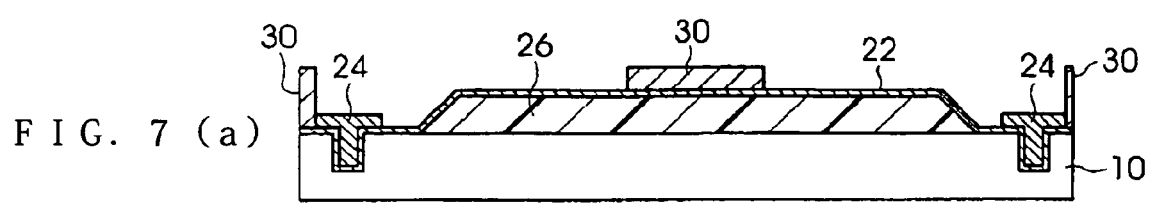
FIG. 7(a) through FIG. 7(c) are cross-sectional views of the process following FIG. 2(g).
Figure 7:
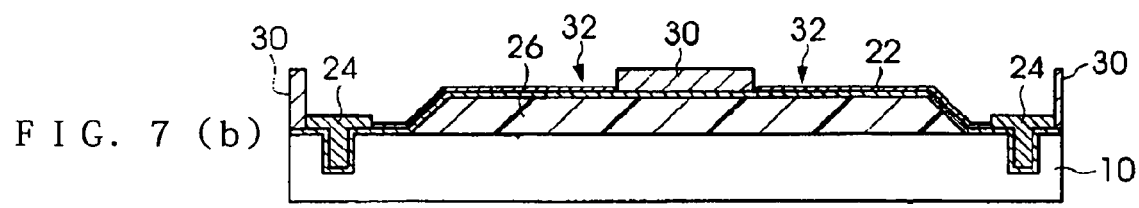
Figure 7:
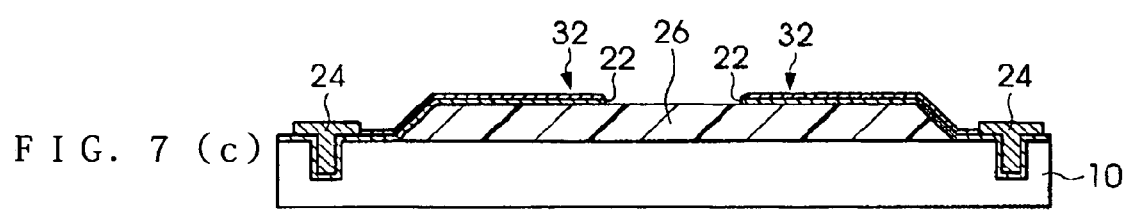

After forming the stress relief layer 26 and the coupling terminal 24 on the active surface 10a side of the substrate 10, the step of forming the rearrangement wiring on the active surface 10a side of the substrate 10 is carried out. FIG. 7 is a view showing the step of forming the rearrangement wiring 32 in the manufacturing method of the semiconductor device according to one embodiment of the present invention. In this step, first, the plating resist is applied on the entire surface of the substrate 10, that is, on the coupling terminal 24 and the base film 22, and patterned into a state in which only the portion forming the rearrangement wiring 32 is opened, and the rearrangement plating resist pattern 30 is formed as shown in FIG. 7a.

Thereafter, the Cu electrolytic plating is carried out, and as shown in FIG. 7b, the rearrangement wiring 32 is formed on the stress relief layer 26 via the base film 22. FIG. 7b is a cross sectional view showing the state in which the rearrangement wiring 32 is formed. This rearrangement wiring 32 is formed not only on the stress relief layer 26, but also in a form extending to a forming position of the coupling terminal 24 from the stress relief layer 26. Further, it is electrically coupled with the coupling terminal 24.

When the rearrangement wiring 32 is formed, a rearrangement plating resist pattern 30 formed on the substrate 10 is peeled. Then, by etching the entire active surface 10a side of the substrate 10 including the rearrangement wiring 32, the seed layer is etched back. Here, since the film thickness of the rearrangement wiring 32 is about 20 times thicker than the film thickness of the seed layer, the rearrangement wiring 32 is not completely etched by the etch back.

Next, since the rearrangement wiring 32 composed of Cu (copper) is not etched by the RIE, the seed layer is etched, so to say, by applying the RIE using the rearrangement wiring 32 as a mask. Accordingly, only the barrier layer directly below the rearrangement wiring 32 is remained, and an unnecessary barrier layer is etched. In addition, when etching the barrier layer and the seed layer by the wet etching, it is necessary to use the etching liquid that has resistance to the Cu (copper) forming the rearrangement wiring 32.

Here, the unnecessary portion of the base film 22 is, for example, the portion other than the portion in which the coupling terminal 24 and the rearrangement wiring 32 is formed, that is, the portion where the base film 22 is exposed. As described above, the step of etching the base film 22 necessary for forming each coupling terminal 24 and the rearrangement wiring 32 is carried out in one step in the present embodiment, thus the manufacturing process can be simplified.

FIG. 7c is a cross sectional view showing the state in which a rearrangement wiring 32 is formed and an unnecessary portion of the base film 22 is etched. In an example shown in FIG. 7c, it is shown that the base film 22 between the rearrangement wiring 32 is etched. FIG. 8 is an upper surface view of the substrate 10 formed with a rearrangement wiring 32 according to one embodiment of the present invention. In addition, FIG. 8 shows one of a plurality of section areas SA set at an active surface 10a of the substrate 10. As shown in FIG. 8, the coupling terminal 24 is arranged and formed along a pair of sides facing the shot area, and the rearrangement wiring 32 is formed in the state in which one end is coupled to the each coupling terminal 24. Moreover, each of the other ends of the rearrangement wiring 32 is formed with a pad 34.

Figure 9:
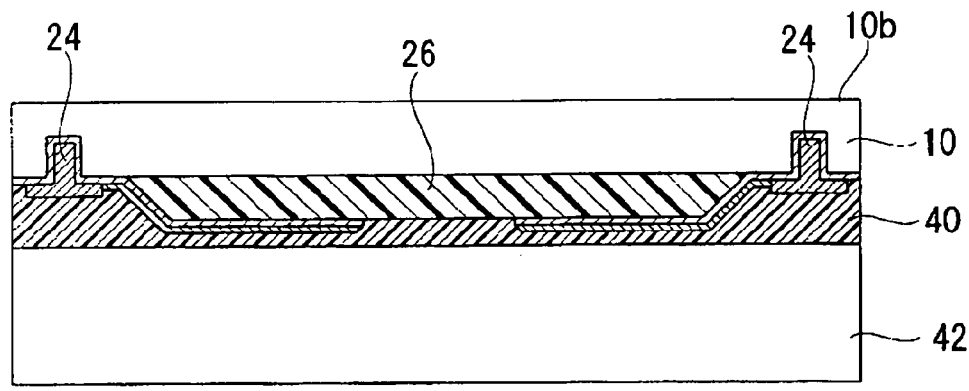
FIG. 9(a) through FIG. 9(c) are cross-sectional views of the process following FIG. 7(c).
Figure 9:
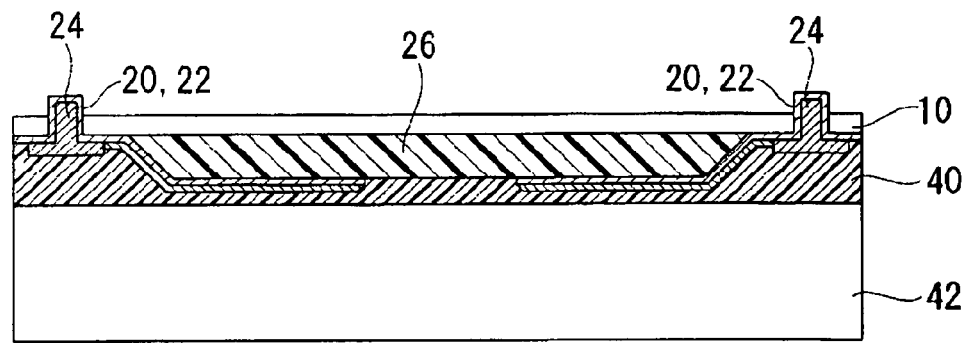
Figure 9:
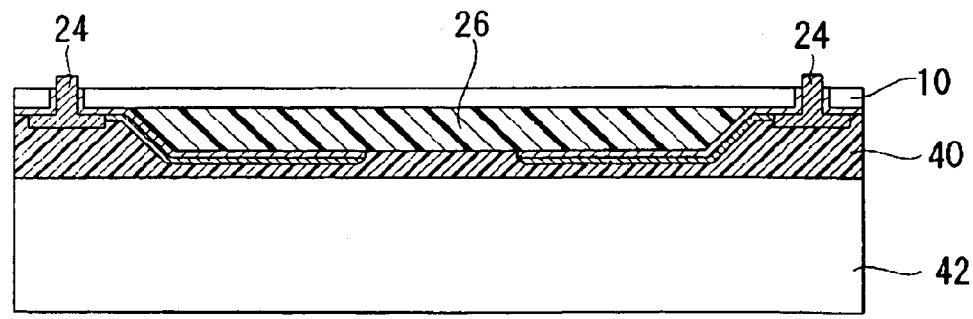

When the above described step is completed, the step of etching the back surface 10b of the substrate 10 and reducing the thickness of the substrate 10 is carried out. FIG. 9 is a view showing a step of etching the back surface of the substrate 10 and reducing the thickness of the substrate 10.

In the present embodiment, the thickness of the substrate 10 is reduced to about 50 µm, however, reducing the thickness of the substrate 10 to this extent, there is a risk of lowering the intensity of the substrate 10 and generating a distortion, or damaging the substrate 10. Accordingly, the supporting member is attached to the active surface side 10a of the substrate 10 (the side in which the rearrangement wiring 32 is formed) to maintain the intensity of the substrate 10 even when the thickness of the substrate 10 is reduced.

FIG. 9a is a cross sectional view showing the state in which the supporting member is attached to the active surface side of the substrate 10.

In the present embodiment, as for the supporting member, an adhesive resin 40 and a flat glass substrate 42 are used. The adhesive resin 40 is for absorbing the irregularity of the coupling terminal 24, the stress relief layer 26, the rearrangement wiring 32 or the like formed on the active surface side 10a of the substrate 10, and it is preferable to use a curable resin such as a thermosetting resin or an UV (ultraviolet rays) cured resin. Moreover, the glass substrate 42 is for maintaining the intensity of the substrate 10, and to facilitate the handling when carrying out the process with respect to the back surface of the thinned substrate 10. In addition, it is preferable to use the substrate 10 that has intensity to an extent that the breakage of the substrate 10 does not occur in the process in the later step, and has a high degree of flatness on both surfaces.

In order to attach the adhesive resin 40 and the glass substrate 42 to the active surface 10a side of the substrate 10, first, the adhesive resin 40 of a liquid form is applied on the active surface 10a side of the substrate 10 using the application method such as spin coating. Next, a heating or an UV irradiation is carried out with respect to the applied adhesive resin 40 to cure the adhesive resin 40. After curing the adhesive resin 40, the adhesive material is applied on the adhesive resin 40 and the glass substrate 42 is attached to the adhesive resin 40.

After the attachment of the adhesive resin 40 and the glass substrate 42 is completed, the step of thinning the substrate 10 is carried out. This step is carried out by polishing or etching the back surface 10b of the substrate 10. FIG. 9b is a cross sectional view showing the state in which the substrate 10 is thinned. In this step, the thickness of the substrate 10 is thinned to about 50 µm, and becomes the state in which a part of the coupling terminal 24 is protruded about 20 µm from the back surface 10b of the substrate 10. Since the insulating film 20 and the base film 22 exists, the coupling terminal 24 itself is not in the exposed state. Therefore, in the next step, the step of sequentially etching the insulating film 20 and the base film 22 from the protruding portion of the coupling terminal 24 which is protruded from the back surface of the substrate 10 is carried out. The insulating film 20 is etched by an oxide film dry etching, and the base film 22 is etched by a metal dry etching or a wet etching. FIG. 9c is a cross sectional view showing the state in which the insulating film 20 and the base film 22 are etched.

After thinning of the substrate 10 is completed, the step of forming an alignment mark (not shown) as a positioning mark on the back surface 10b of the substrate 10 is carried out. This alignment mark is a mark as a standard when depositing the semiconductor chip on the substrate 10, and is formed for each shot area SA.

With the above, the process of depositing the semiconductor chip on the substrate 10 is completed. When the electronic circuit and the coupling circuit 24 are formed on the substrate 10 in this way, an operation test of the electronic circuit formed on each shot area SA is carried out if necessary. In this way, in the mounting step of the semiconductor chip 60 described later, it is possible to mount a non-defective chip only on the normal shot area SA.

Second Step

Next, a second step of manufacturing the semiconductor chip to be deposited on the substrate 10 is explained.

Figure 10:
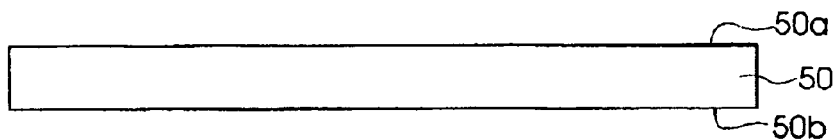
FIG. 10(a) through FIG. 10(g) are cross-sectional views showing the process for manufacturing a semiconductor chip to be deposited on a substrate.
Figure 10:
Figure 10:
Figure 10:
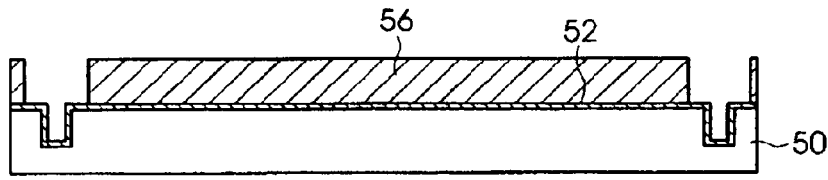
Figure 10:
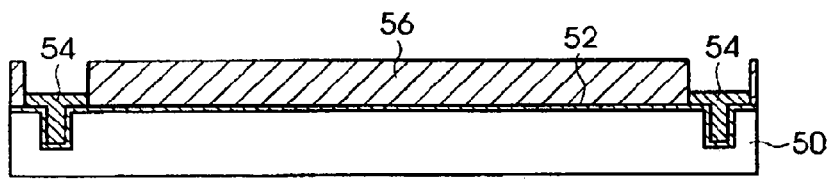
Figure 10:
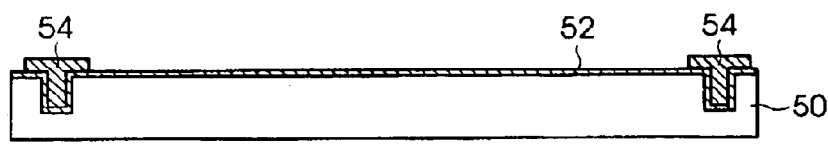
Figure 10:
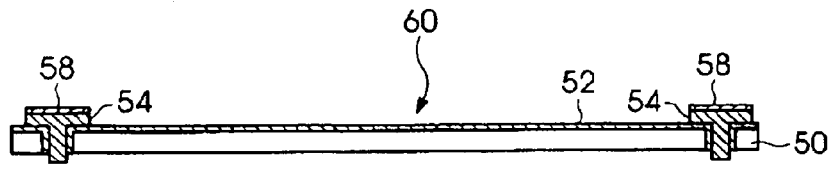

FIG. 10 is a view showing a manufacturing step of manufacturing the semiconductor chip to be deposited on the substrate 10 which has been carried out with the process in the first step. The semiconductor chip is manufactured by carrying out by substantially the same steps as described above in the first step except for the steps of forming the stress relief layer 26, the rearrangement wiring 32, and the alignment mark. Therefore, in the following explanation, the order of the steps are explained briefly, and the detailed explanation thereof is omitted.

A substrate 50 shown in FIG. 10a is, for example, a Si (silicon) substrate, and a plurality of section areas (shot area) are set in the active surface 50a similarly to the substrate 10 shown in FIG. 1. In each section area a transistor, a memory element, other electronic elements, an electronic circuit comprising an electric wiring, and an electrode pad or the like, are formed. On the back surface side 50b of the substrate 50, these electronic circuits are not formed.

Figure 3:
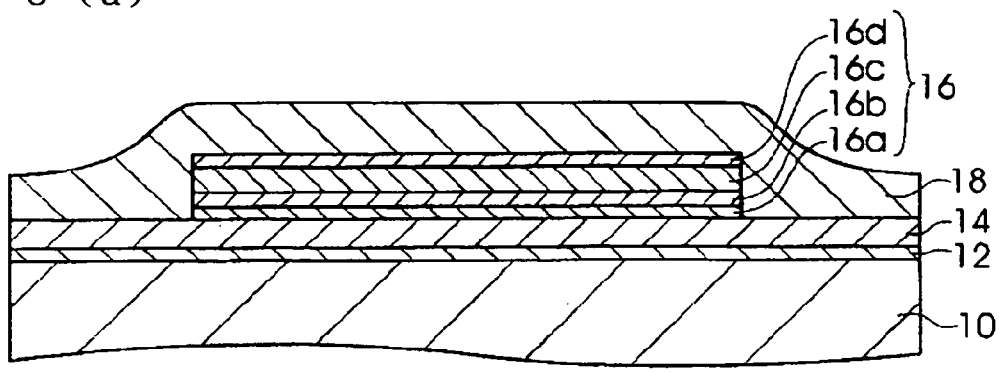
FIG. 3(a) through FIG. 3(c) are cross-sectional views explaining a step of forming a coupling terminal in the manufacturing method of a semiconductor device of the present invention.
Figure 3:
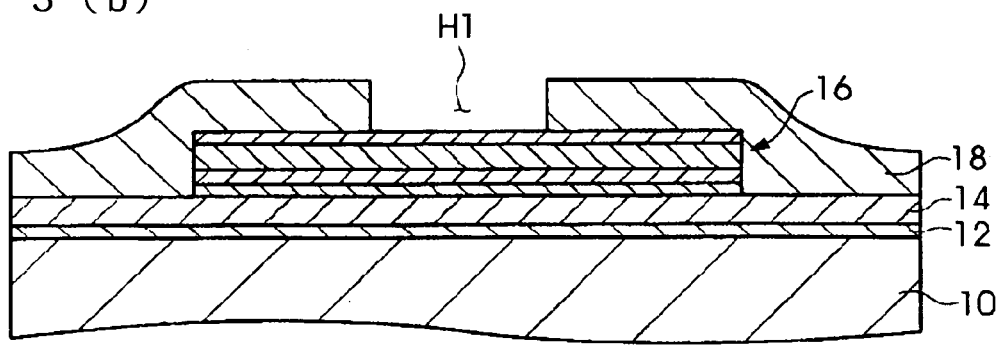
Figure 3:
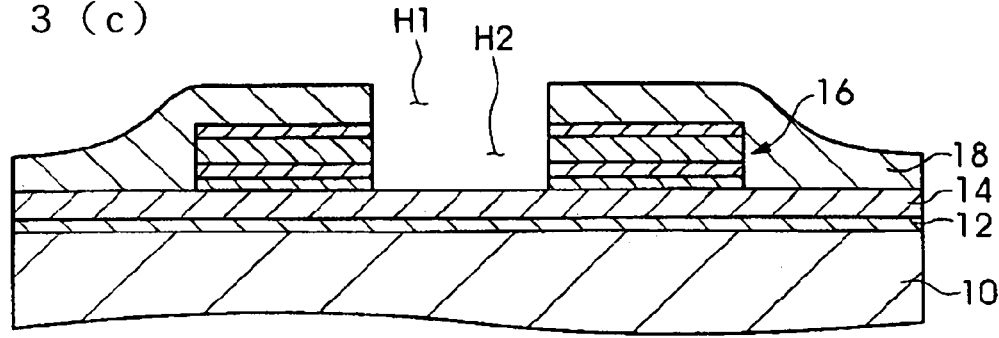
Figure 5:
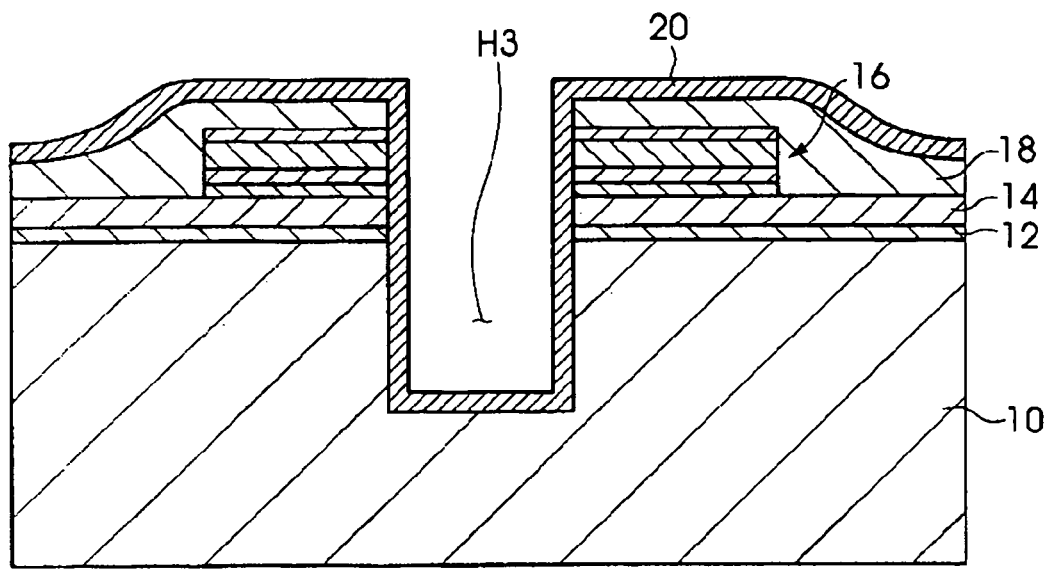
FIG. 5(a) and FIG. 5(b) are cross-sectional views of the process following FIG. 4(b).
Figure 5:
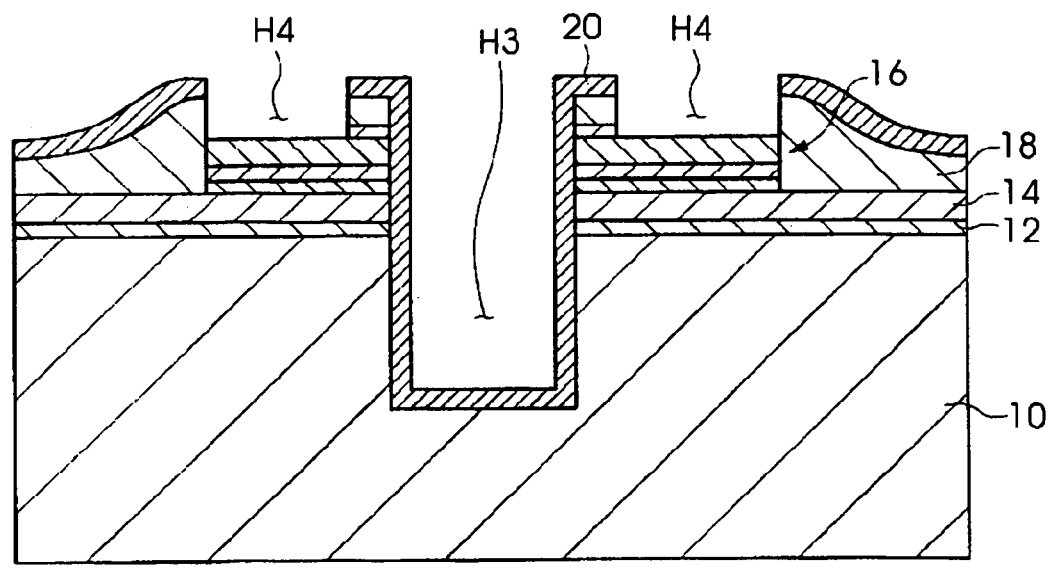
Figure 6:
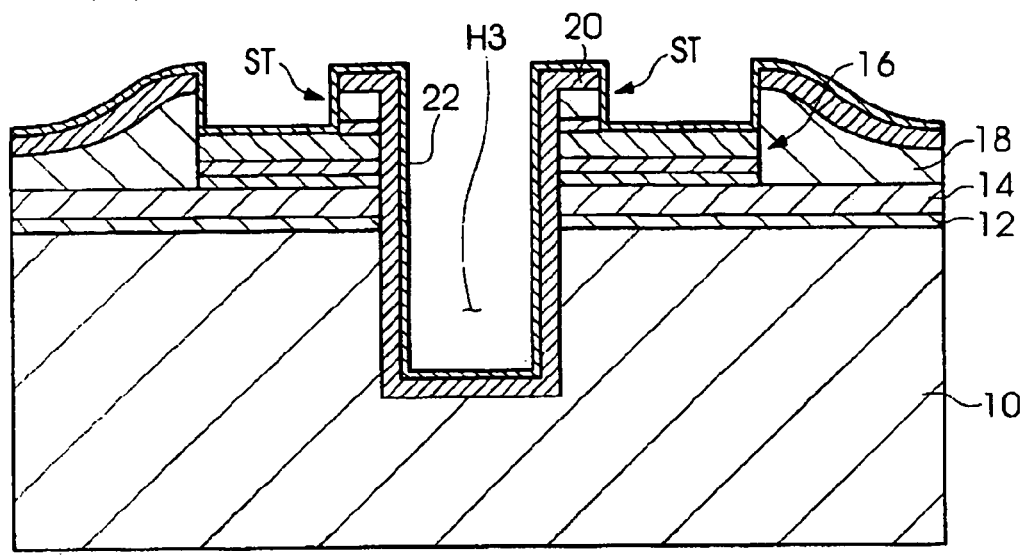
FIG. 6(a) and FIG. 6(b) are cross-sectional views of the process following FIG. 5(b).
Figure 6:
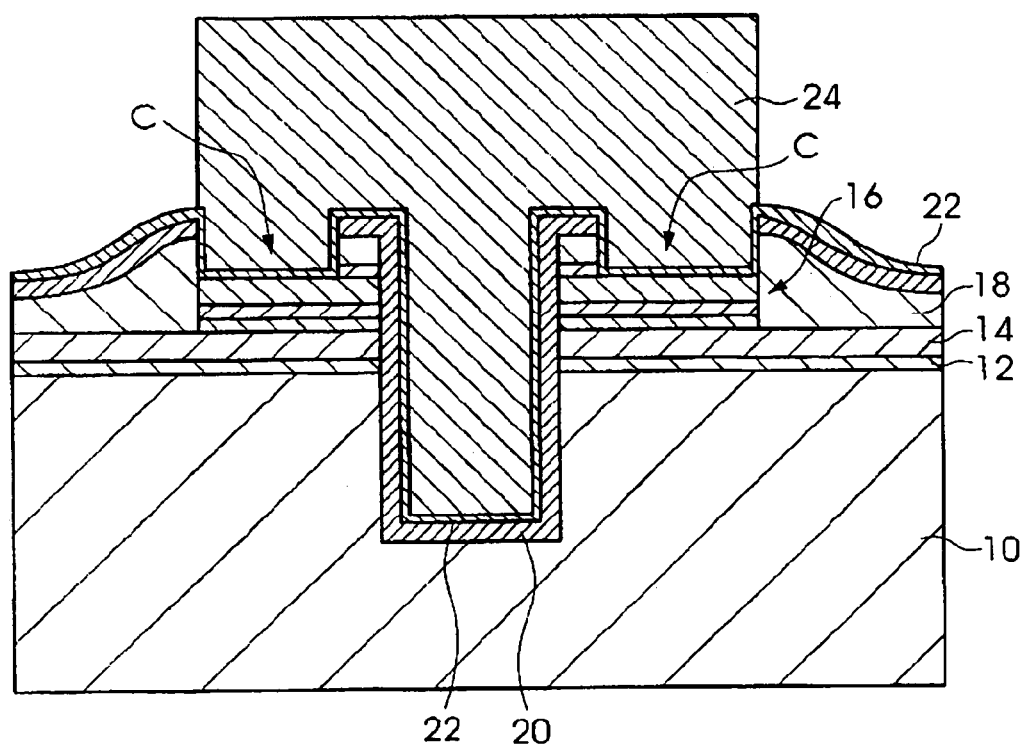

With respect to this substrate 50, similarly to the first step, the step of opening the electrode pad and forming a hole portion H10 by boring the substrate 50 is carried out. FIG. 10b is a cross sectional view showing the state in which the hole portion H10 is formed by boring the substrate 50. In addition, the opening of the electrode pad and the forming of the hole portion H10 is carried out in the same steps as shown in FIG. 3 and FIG. 4. Next, a base film composed of the insulating film, the barrier layer and the seed layer is sequentially formed on the active surface 50a side of the substrate 50 including the bottom surface and the inner wall of the hole portion H10. FIG. 10c is a cross sectional view showing a state in which the insulating film and the base film are formed on the active surface 50a side of the substrate 50. In FIG. 10c, only the base film 52 is shown. The insulating film is omitted in FIG. 10c. The formation of the insulating film and the base layer 52 is carried out in the same steps as shown in FIG. 5 through FIG. 6a.

Next, a plating resist pattern 56 is formed when a plating resist is applied on the active surface 50a of the substrate 50, and it is patterned into a state in which only a portion forming the coupling terminal 54 is opened. FIG. 10d is a cross sectional view showing the state in which the plating resist pattern is formed. Then, the Cu electrolytic plating is carried out when Cu is embedded in the hole portion H10 and the open portion of the plating resist pattern 56 of the substrate 50 as shown in FIG. 10e, and a coupling terminal 54 as a through electrode is formed. FIG. 10e is a cross sectional view showing the state in which the coupling terminal 54 is formed by the Cu electrolytic plating.

When the coupling terminal 54 is formed, as shown in FIG. 10f, the plating resist pattern 56 formed on the substrate 50 is peeled. FIG. 10f is a cross sectional view showing the state in which the plating resist pattern 56 is peeled after forming the coupling terminal 54. Next, an unleaded solder (Sn/Ag) 58 (refer to FIG. 10f) is formed on the formed coupling terminal 54. This unleaded solder 58 is for joining the coupling terminal 54 as the through electrode of the semiconductor chip and the coupling terminal 24 of the substrate 10, when depositing the semiconductor chip on the substrate 10 which has been carried out with the process in the above described first step.

After the above described step is completed, the same supporting member as the adhesive resin 40 and the glass substrate 42 shown in FIG. 9 is attached to the active surface 50a side of the substrate 50, and the same step as the step shown in FIG. 9 is carried out for thinning the substrate 50. After the step of thinning is completed, the substrate 50 is cut by a laser or a blade after the supporting member is detached, and is divided in to an individual semiconductor chip 60. After the above described step, the semiconductor chip 60 is manufactured.

With the above, the semiconductor chip 60 to be deposited on the substrate 10 is manufactured. Next, the third step of depositing the semiconductor chip 60 on the substrate 10 is described.

Third Step

The substrate 10 completed in the first step is, as shown in FIG. 9c, attached with the adhesive resin 40 and the glass substrate 42 to the active surface 10a side of the substrate 10, and with the alignment mark that is formed on the back surface 10b of the substrate 10. With respect to this substrate 10, in order to deposit the semiconductor chip 60 manufactured in the second step, first, a joining activator (flux) is applied on the unleaded solder 58 formed on the coupling terminal 54 as the through electrode of the semiconductor chip 60. The flux is necessary to have a viscosity and an amount sufficient to hold the semiconductor chip 60 when depositing the semiconductor chip 60 on the substrate 10.

Next, one or a plurality of semiconductor chips 60 are deposited on each shot area SA based on the above described alignment mark. The deposited semiconductor chip 60 is held by the adhesion of the flux applied on the unleaded solder 58.

When the operation test of each shot area SA is carried out in the above described first step, the non-defective semiconductor chip 60 may be deposited only on the non-defective shot area SA. In this way, the non-defective semiconductor chip 60 does not need to be wasted. In this case, the defective shot area SA can be made as an open area, however in view of enhancing the reliability of the later described sealing step, it is preferable to mount a dummy chip on this shot area. By not providing an open area, (that is, mount at least one or more chip on the entire shot area SA), the flow of the sealing resin 62 becomes uniform, and the air bubble is hardly mixed inside the resin.

Figure 11:
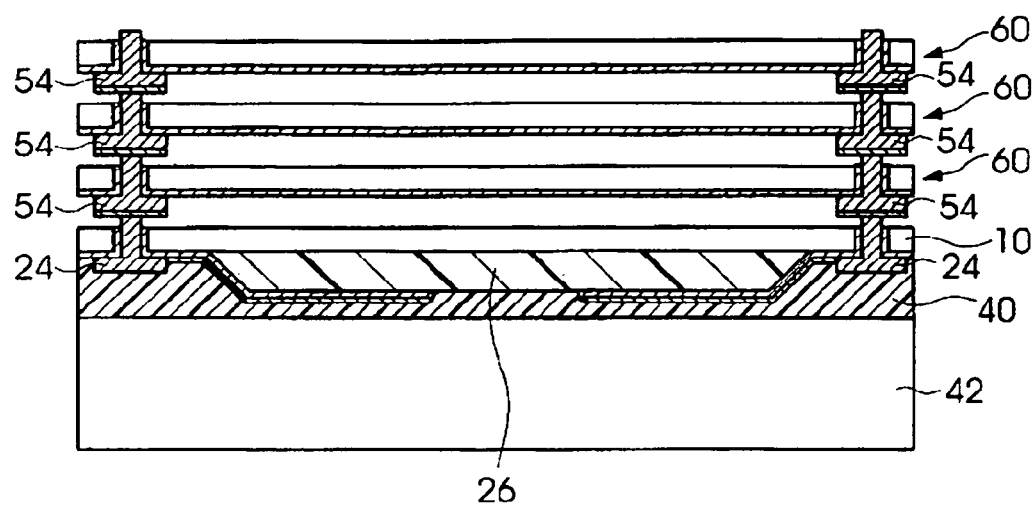
FIG. 11 is a cross-sectional view showing the state in which a plurality of semiconductor chips are deposited on a back surface side of the substrate via the coupling terminal or a through electrode.

When the deposition of the semiconductor chip 60 is completed, joining of the coupling electrode 24 formed on the substrate 10 and the terminal electrode 54 formed on the semiconductor chip 60, and joining of each terminal electrodes 54 formed on the semiconductor chip 60 are carried out. In this joining step, the substrate 10 deposited with the semiconductor chip 60 is put into a reflow device, and the coupling electrode 24, the coupling electrode 54, and each coupling electrode 54 are joined by the unleaded solder 58. Accordingly, the coupling electrode 24 and the coupling electrode 54 are electrically coupled. FIG. 11 is a cross sectional view showing the state in which the coupling electrode 24 formed on the substrate 10 and the coupling electrode 54 formed on the semiconductor chip 60 are joined, and the semiconductor chip 60 is deposited on the substrate 10.

When the above described step is completed, the step of sealing the deposited semiconductor chip 60 and the substrate 10 together is performed by transfer molding. FIG. 12a is a view showing a state in which the substrate 10 and the semiconductor chip 60 are sealed. As shown in FIG. 12a, the sealing is carried out in a state in which the adhesive resin 40 and the glass substrate 42 are attached to the substrate 10. The sealing resin (sealing material) 62 is formed so as to cover the entire back surface of the substrate 10, and seal the entire semiconductor chip 60.

Figure 14:
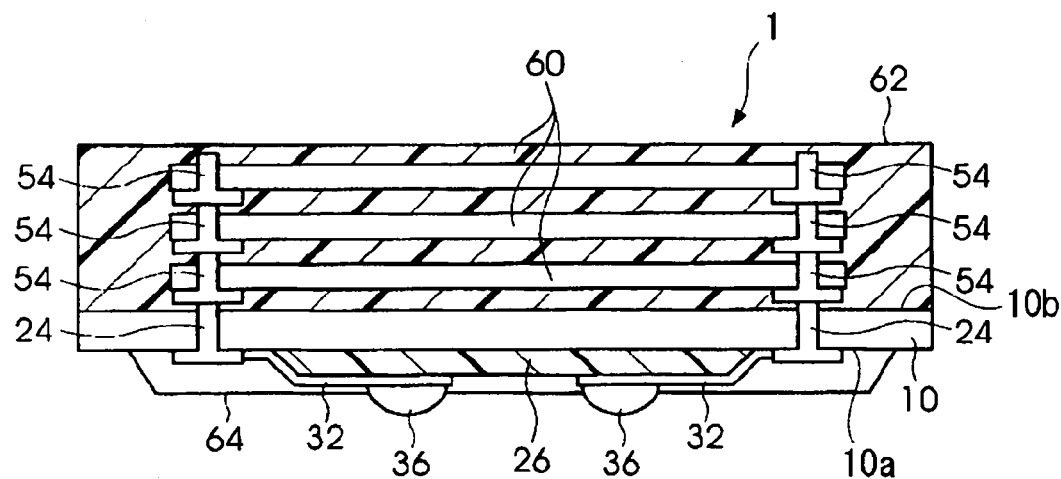
FIG. 14 is a cross-sectional view showing the schematic structure of the three-dimensionally mounted semiconductor device manufactured by the manufacturing method of a semiconductor device of the present invention.

When the sealing of the substrate 10 and the semiconductor chip 60 is completed, the adhesive resin 40 and the glass substrate 42 are detached from the substrate 10, and the substrate 10 is cut for every shot area SA, and is divided into an individual semiconductor device 1 (refer to FIG. 14). Such a cutting step is carried out from the active surface 10a side of the substrate 10 using the sealing resin 62 as the supporting member. As for the cutting method of the substrate 10, for example, the cutting method using the laser or the cutting method of the dicing or the like can be applied, however, in this case, it is preferable not to fully cut the substrate 10 and the sealing resin 62 by the same cutting member (blade or the like), and it is preferable to select the optimal cutting method according to the respective material.

In this case, first, as shown in FIG. 12b, only the substrate 10 is diced by putting in the blade between the shot areas SA of the substrate 10. It is preferable to use the sealing resin 62 formed on the back surface 10b of the substrate 10 as the supporting member. The supporting member for supporting the substrate 10 can be separately prepared, however, by using the sealing resin 62 instead of the supporting member, the attaching step of the supporting member or the like can be omitted.

Figure 13A:
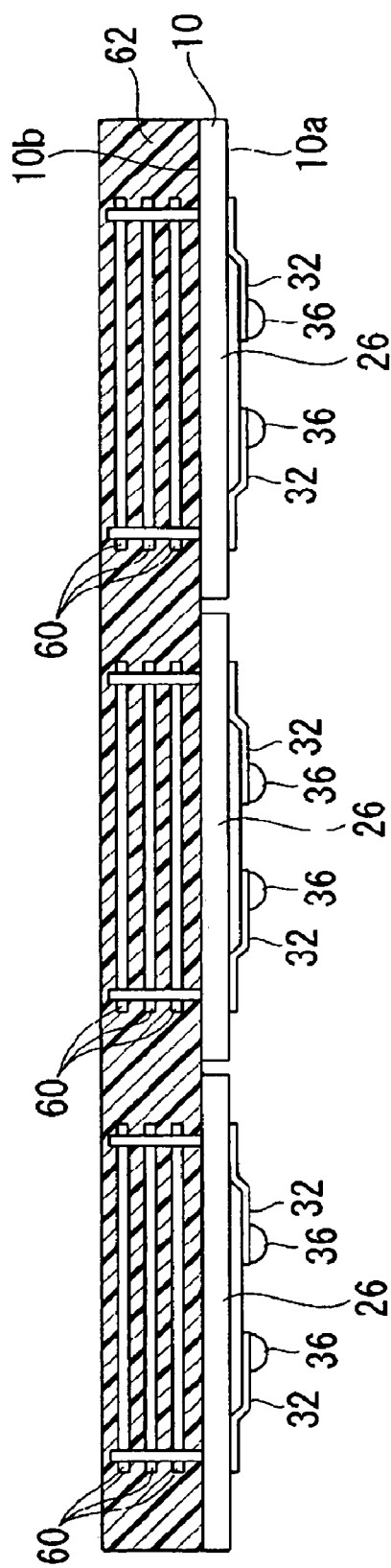
FIG. 13(a) and FIG. 13(b) are cross-sectional views of the process following FIG. 12(b).
Figure 13B:
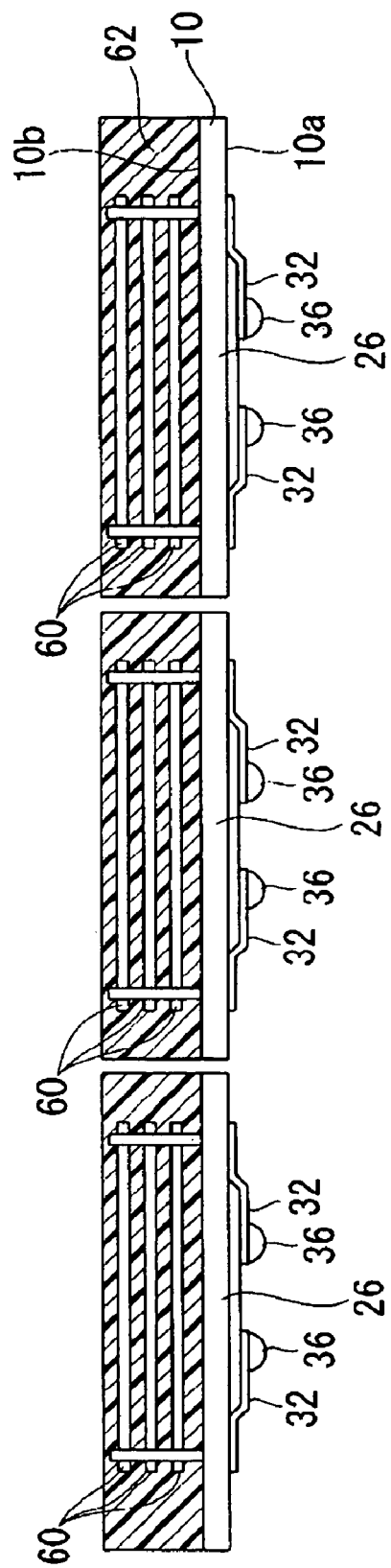

Then, as shown in FIG. 13a, a bump 36 is formed on the pad 34 formed on the tip end portion of the rearrangement wiring 32, and the electrical property of the semiconductor device (individual semiconductor device before dividing) formed on each shot area SA are tested all together. Next, as shown in FIG. 13b, the sealing resin 62 is cut by a blade or a laser different than the one that cut the substrate 10.

By optimally selecting the cutting method according to the material to be cut (substrate 10 and sealing resin 62 or the like), process time can be shortened, and the wasting of the cutting material can be reduced. In addition, the semiconductor device 1 divided in this step is selected as either non-defective or defective based on the above described testing result, and only the non-defective is picked up.

FIG. 14 is a cross sectional view showing the semiconductor device 1 manufactured by one embodiment of the present invention.

The semiconductor device 1 in this case, as shown in FIG. 14, on the substrate 10 as a first semiconductor chip formed with a coupling terminal 24, has a structure in which the semiconductor chip 60 as a second semiconductor chip formed with a coupling terminal 54 as a through electrode is plurally deposited. The substrate 10, the semiconductor chip 60, and each additional semiconductor chip 60 are deposited via the coupling terminal 24 or the through electrode 54, and are electrically coupled to each other. Moreover, on active surface 10a side of the substrate 10, the stress relief layer 26, the rearrangement wiring 32, and the bump 36 are formed. In addition, in FIG. 14, the reference numeral 64 is a primary reinforcement resin for enhancing the fixation intensity of the bump 36 with respect to the pad 34.

As described above, the manufacturing method of the semiconductor device of the present invention deposits the semiconductor chip 60 on the substrate 10 that is in the state of a so-called wafer without cutting the substrate 10, and after sealing the deposited semiconductor chip 60 all together, these are cut and divided into an individual semiconductor device, therefore the manufacturing process can be simplified as compared to the case when depositing the semiconductor chip on the interposer.

Moreover, in the present method, since the active surface 10a of the substrate 10 finally becomes the mounting surface, by forming the rearrangement wiring 32 or the like on the active surface side in advance simultaneously with the coupling terminal 24 or the like, the step can be further simplified. Moreover, in the present method, since the rearrangement wiring 32 or the like are formed on the active surface side of the substrate 10, it becomes easier to form as compared with the conventional case in which the rearrangement wiring or the like are formed on the back surface (polishing surface) of the substrate.

Moreover, in the present method, since the cutting of the substrate 10 is carried out from the active surface 10a side, chipping hardly occurs as compared to the case, for example, when carrying out the cutting from the back surface side of the substrate. That is, when the dicing or the like is carried out from the back surface side of the substrate, the active surface side of the substrate is fixed with a dicing tape or the like. However, such a dicing tape is required to be thin, so as a result, the substrate as the adhered sometimes cannot be sufficiently held (that is, oscillation occurs between the adhered and the tape). When such oscillation occurs when cutting, there is a risk of chipping a part of the substrate (chipping) when the tip end portion of the blade penetrates to the tape side from the substrate. With respect to the present method, since the substrate 10 is surely held by the sealing resin 62 of a thick film that seals the semiconductor chip 60, when the tip end portion of the blade penetrates from the substrate 10 to the sealing resin 62 side, space between the two does not oscillate.

Moreover, in the present method, an electrical property testing of each semiconductor device is carried out all together before the cutting step of the substrate 10 (that is, in the state of wafer), the testing becomes easier as compared with the case in which these are divided into an individual semiconductor device. Moreover, in the present method, in the cutting step of the substrate, since the cutting method of the substrate body 10 and the sealing resin 62 formed thereon is optimally selected according to the material or the like thereof, the cutting time can be further shortened, and also the waste of the cutting material can be reduced.

Next, a circuit substrate and electronic equipment comprising the semiconductor device 1 of the present invention will be described.

Figure 15:
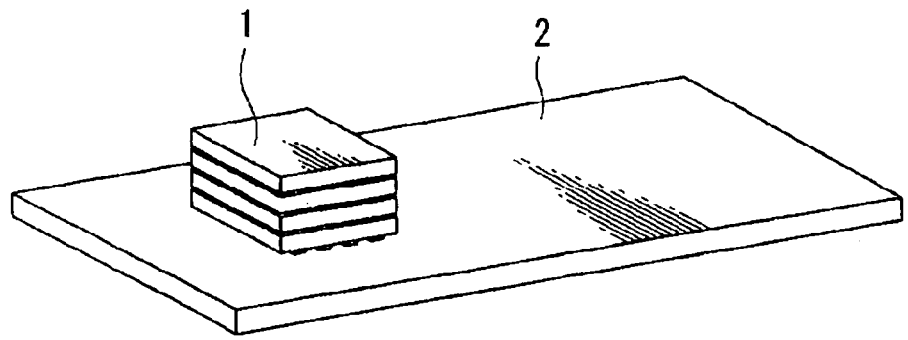
FIG. 15 is a perspective view showing an example of a circuit substrate of the present invention.

FIG. 15 is a perspective view showing an example of the circuit substrate of the present invention. As shown in FIG. 15, on the circuit substrate 2, the semiconductor device 1 three-dimensionally mounting an IC chip having the above described rearrangement wiring, is mounted. The circuit substrate 2 is composed of, for example, an organic substrate of glass epoxy substrate or the like, and for example, a wiring pattern (not shown) composed of copper or the like is formed into a desired circuit, and further, the pad (not shown) is coupled to this wiring pattern. By electrically coupling the solder ball of the semiconductor device 1 on this pad, the semiconductor device 1 is mounted on the circuit substrate 2.

Figure 16:
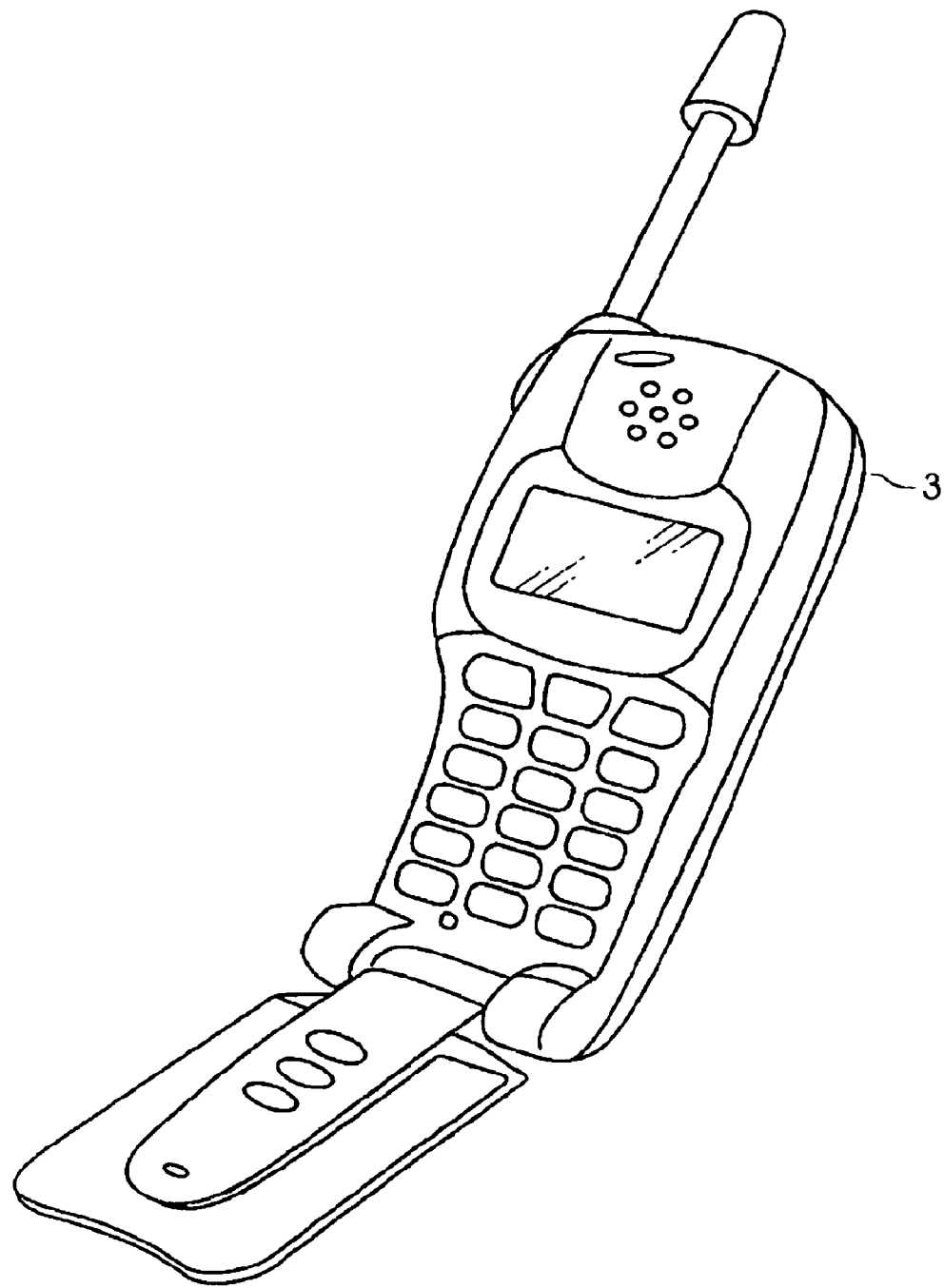
FIG. 16 is a perspective view showing an example of electronic equipment of the present invention.

FIG. 16 is a perspective view showing a schematic structure of a portable phone as one embodiment of electronic equipment of the present invention. As shown in FIG. 16, this portable phone 3 provides the semiconductor device 1 or the circuit substrate 2 inside the casing thereof.

In addition, as for the electronic equipment, it is not limited to the above described portable phone, and may be applied to various electronic equipment. For example, it may be applied to electronic equipment of a device or the like having a notebook computer, a liquid crystal projector, a personal computer (PC) and an engineering workstation (EWS) adapted for multimedia, a pager, a word processor, a television, a video tape recorder of a view finder type or a monitor direct viewing type, an electronic notebook, an electronic desk calculator, a car navigation device, a POS terminal, and a touch panel.

A description is given above for the preferred embodiment according to the present invention with reference to the accompanying drawings, however, it is needless to say that the present invention is not limited to the example. Various shapes and combinations or the like of each constructional member shown in the above described example are just examples, and it is possible to variously modify the example based on the design requirement or the like within the scope and spirit of the invention.

What is claimed is:

1. A method of manufacturing a semiconductor device, comprising:

providing a substrate having an active surface side formed with a plurality of electronic circuits and a back surface side positioned on an opposite side of the substrate from the active surface side;

embedding a coupling terminal on the active surface side of the substrate such that a protruding portion of the coupling terminal is embedded into the active surface of the substrate, the coupling terminal forming an external electrode of one of the electronic circuits;

exposing a part of the protruding portion of the coupling terminal by polishing the back surface side of the substrate;

mounting a semiconductor chip on the back surface side of the substrate via the coupling terminal;

sealing the semiconductor chip mounted on the substrate with a sealing material; and cutting the substrate along at least the one electronic circuit to yield the semiconductor device.

2. The method of manufacturing a semiconductor device according to claim 1, wherein the cutting step further comprises cutting from the active surface side of the substrate.

3. The method of manufacturing a semiconductor device according to claim 2, wherein the cutting step further comprises dicing the substrate using the sealing material as a supporting material.

4. The manufacturing method of manufacturing a semiconductor device according to claim 1, further comprising a step of collectively testing each semiconductor chip prior to the cutting step.

5. The method of manufacturing a semiconductor device according to claim 1, further comprising:

testing each electronic circuit formed on the active surface prior to the mounting step; and wherein the mounting step further comprises mounting the semiconductor chip only with respect to the electronic circuit that proves non-defective in the testing step.

6. The method of manufacturing a semiconductor device according to claim 5, wherein the mounting step further comprises mounting a dummy chip with respect to the electronic circuit that proves defective in the testing step.

7. The method of manufacturing a semiconductor device according to claim 1, wherein:

the mounting step further comprises depositing a plurality of the semiconductor chips on the back surface side of the substrate via a through electrode provided in each of the plurality of semiconductor chips.

8. The method of manufacturing a semiconductor device according to claim 1, further comprising forming a rearrangement wiring on the active surface side of the substrate.

* * * * *